US012625198B1

(12) United States Patent
Lyu

(10) Patent No.: US 12,625,198 B1
(45) Date of Patent: May 12, 2026

(54) INTEGRATED UNIVERSAL SERIAL BUS DATA CABLE TESTING DEVICE AND TESTING METHOD

(71) Applicant: Yanjun Lyu, Dongguan (CN)

(72) Inventor: Yanjun Lyu, Dongguan (CN)

( * ) Notice: Subject to any disclaimer, the term of this patent is extended or adjusted under 35 U.S.C. 154(b) by 0 days.

(21) Appl. No.: 19/312,313

(22) Filed: Aug. 28, 2025

(30) Foreign Application Priority Data

Jul. 2, 2025 (CN) .......................... 202510914893.9

(51) Int. Cl.
*G01R 31/58* (2020.01)
*G01R 31/54* (2020.01)

(52) U.S. Cl.
CPC ............. *G01R 31/58* (2020.01); *G01R 31/54* (2020.01)

(58) Field of Classification Search
CPC ................................ G01R 31/58; G01R 31/54
See application file for complete search history.

(56) References Cited

U.S. PATENT DOCUMENTS

| | | | | |
|---|---|---|---|---|
| 5,280,251 A | * | 1/1994 | Strangio | G01R 31/58 |
| | | | | 324/133 |
| 2017/0147526 A1 | * | 5/2017 | Chen | G06F 13/4068 |
| 2018/0128694 A1 | * | 5/2018 | Wee | G01K 15/00 |

FOREIGN PATENT DOCUMENTS

| | | | | |
|---|---|---|---|---|
| CN | 108061839 A | * | 5/2018 | ............. G01R 31/58 |
| EP | 3035064 A1 | * | 6/2016 | ............. G01R 31/50 |

OTHER PUBLICATIONS

English translation of CN-108061839-A (Year: 2018).*

* cited by examiner

*Primary Examiner* — Thang X Le
*Assistant Examiner* — Haidong Zhang
(74) *Attorney, Agent, or Firm* — Hemisphere Law, PLLC

(57) ABSTRACT

An integrated USB data cable testing device includes: a multi-port testing board, integrating at least seven types of USB ports and a Lightning port; a main controller module, including: a main control MCU configured to perform continuity detecting, protocol parsing, and resistance calculation, and a protocol parsing chip connected to the main control MCU via an I²C bus; an integrated detection module, including a continuity detecting circuit, an internal resistance testing circuit, an E-marker identification circuit, a charging head detecting circuit, and a pull-up/pull-down resistance detecting circuit, where the continuity detecting circuit is connected to pins of USB output and input ends, and the E-marker identification circuit and the charging head detecting circuit are connected to CC pins of the protocol parsing chip. The testing device and method support continuity detection, internal resistance measurement, cable protocol identification, charger protocol identification, and E-marker chip parsing functions.

10 Claims, 3 Drawing Sheets

INTEGRATED UNIVERSAL SERIAL BUS DATA CABLE TESTING DEVICE AND TESTING METHOD

TECHNICAL FIELD

The disclosure relates to the technical field of electronic testing equipment, and more particularly to an integrated universal serial bus (USB) data cable testing device and a testing method.

BACKGROUND

Existing USB testing devices typically support only a single function (such as continuity detection or protocol identification) and are unable to comprehensively assess the cable quality (such as internal resistance, E-Marker, pull-up/pull-down resistance, etc.). Users need to switch devices multiple times to complete a comprehensive test. Moreover, traditional testing methods rely on specialized instruments (such as oscilloscopes and multimeters) and complex operating procedures, which are difficult for ordinary users or production line personnel to quickly master, thereby affecting testing efficiency.

Most testing devices on the market only support a single port type (such as USB Type-C) and cannot cover mainstream cable types such as USB Type-A, USB Micro B 2.0/3.0, USB Mini B, and Lightning, which limits the testing scenarios. Additionally, the testing devices often rely on fixed power supplies and lack battery power options, making it difficult to meet the testing needs in outdoor or mobile scenarios. Test results are usually displayed as numerical values or simple indicator lights, lacking an intuitive graphical interface (such as a liquid crystal display screen showing cable structure diagrams and protocol details), which increases the cost for the users to interpret the results.

SUMMARY

In view of the foregoing, the disclosure provides an integrated USB data cable testing device and a testing method that supports continuity detection, internal resistance measurement, cable protocol identification, charger protocol identification, and E-marker chip parsing functions. With a single device, multiple testing functions can be realized, reducing the cost of testing equipment. The integrated USB data cable testing device supports a dual-power supply system for mobile scenarios, allows one-click switching of testing modes, accurately identifies the performance of a USB data cable, and reduces electronic waste.

In order to achieve above purposes, the disclosure provides the following technical solutions.

Based on the above purposes, in a first aspect, the disclosure provides an integrated USB data cable testing device. The integrated USB data cable testing device includes: a multi-port testing board, a main controller module, an integrated detection module, a dual-mode power supply module, and a human-machine interaction module.

The multi-port testing board integrates at least seven types of USB ports and a Lightning port.

The main controller module includes: a main control microcontroller unit (MCU), and a protocol parsing chip. The main control MCU is configured to perform continuity detecting, protocol parsing, and resistance calculation, and the protocol parsing chip is connected to the main control MCU via an inter-integrated circuit ($I^2C$) bus.

The integrated detection module includes: a continuity detecting circuit, an internal resistance testing circuit, an E-marker identification circuit, a charging head detecting circuit, and a pull-up/pull-down (pull-up and pull-down) resistance detecting circuit. The continuity detecting circuit is connected to pins of a USB output end and a USB input end, and the E-marker identification circuit and the charging head detecting circuit are connected to configuration channel (CC) pins of the protocol parsing chip.

The dual-mode power supply module includes: an AAA battery compartment, an external USB type-C power supply port, and a switch for power supply switching. The dual-mode power supply module is configured to support AAA battery power supply and external USB type-C power supply, and the switch for power supply switching is a mechanical switch for power supply switching.

The human-machine interaction module includes: a liquid crystal display (LCD) screen and a function switching button. The human-machine interaction module is configured to display continuity topology diagrams, internal resistance values, E-marker information, data cable protocol types, charging head protocols, and pull-up/pull-down resistance values.

In an embodiment, the at least seven types of USB ports include: a USB type-C port for power supply and programming, two USB type-C cable testing ports, a USB micro B 2.0 port, a USB micro B 3.0 port, a USB mini 2.0 port, and a USB type-A 3.0 port. The Lightning port is a Lightning testing port.

In an embodiment, the main control MCU is an STC32G12K128 microcontroller, the protocol parsing chip comprises an FUSB302BMPX chip connected to the main control MCU via the $I^2C$ bus, and the protocol parsing chip is configured to parse CC1/CC2 (CC1 and CC2) signals of a USB type-C cable to read E-marker and charging head protocol data.

In an embodiment, a working process of the continuity detecting circuit includes:

applying a preset level signal via the USB output end, monitoring voltage changes at respective pins of the USB input end, identifying pin combinations with complete signal paths, and generating and outputting cable topology data to the LCD screen.

In an embodiment, the internal resistance testing circuit includes a metal oxide semiconductor (MOS) transistor and a 5.1 ohms ($\Omega$) reference resistor with an accuracy of $\pm1\%$ to form a series voltage divider circuit, and a gate of the MOS transistor is controlled by the main controller module.

In an embodiment, a working process of the internal resistance testing circuit includes:

making, by the main controller module, the MOS transistor conduct to activate the MOS transistor to form a series loop with a power supply, the 5.1 $\Omega$ reference resistor, and a cable voltage bus (VBUS), to thereby allow current to flow sequentially through the MOS transistor, the 5.1$\Omega$ reference resistor, and a VBUS path of a cable to be tested;

measuring a voltage difference $\Delta V$ at a series node; and calculating a cable internal resistance based on Ohm's law as follows:

$$R\_cable = (V\_measured \times R14)/(V\_source - V\_measured);$$

where V_source represents a supply voltage, R14 represents a resistance value of the 5.1Ω reference resistor, and V_measured represents an actual voltage measured across the 5.1 Ω reference resistor.

In an embodiment, a working process of the E-marker identification circuit includes:

sending, by the main control MCU, a detection command to the protocol parsing chip;

sending, by the protocol parsing chip, a USB-power delivery (PD) protocol query message through CC1/CC2 pins;

parsing a power supply capability data packet returned by an E-marker chip, and transmitting the power supply capability data packet to the main control MCU for protocol classification via the I²C bus; and extracting, by the main control MCU, specification parameters including voltage/current (voltage and current), charger protocol identification, a cable type, a cable delay, a cable transmission speed, a cable supplier, a cable version number, and a cable protocol, and generating, by the main control MCU, a visual report.

In an embodiment, the pull-up/pull-down resistance detecting circuit includes: controlled MOS transistors and fixed-value resistors, and the main controller module is configured to determine presence of a pull-up resistor and a pull-down resistor by switching ground (GND) pin levels (floating/pulled low) of the USB type-A 3.0 port, the USB type-C port and the two USB type-C cable testing ports.

In an embodiment, a working process of the pull-up/pull-down resistance detecting circuit includes:

grounding a VBUS of each of the USB type-A 3.0 port, the USB type-C port and the two USB type-C cable testing ports, and setting a GND pin of each of the USB type-A 3.0 port, the USB type-C port and the two USB type-C cable testing ports to a high-impedance state (referring to an output signal state in which the signal is not being driven, behaving as if it were disconnected);

turning on, by the main controller module, an MOS transistor of the controlled MOS transistors, and applying, by the main controller module, a test voltage V_test on a CC line; and when V_cc<V_source, determining that the pull-up resistor exists and calculating a resistance value of the pull-up resistor;

when V_cc≈V_source, pulling down the GND pin followed by re-detecting;

when Vcc<V_source, determining that the pull-down resistor exists and calculating a resistance value of the pull-down resistor.

In an embodiment, the human-machine interaction module includes multi-level testing interfaces, including: a continuity test interface, a protocol test interface, an E-marker test interface, a charging head detection interface, a pull-up/pull-down resistor test interface, and an internal resistance test interface.

The continuity test interface is configured to display a topology diagram of a cable pin connection status.

The protocol test interface is configured to display a support status of USB 2.0/3.2/PD protocols.

The E-Marker test interface is configured to display power specifications and certification information of the cable.

The charging head detection interface is configured to display power supply protocols supported by a charging head.

The pull-up/pull-down resistor test interface is configured to display whether the pull-up resistor and the pull-down resistor are present on the CC line and output their resistance values.

The internal resistance test interface is configured to display the resistance values of the VBUS/GND lines and the qualification threshold.

In an embodiment, the Lightning testing port only supports: the continuity detection, and the internal resistance detection. The continuity detection includes: testing the connectivity of the power line, data line, and ID line. The internal resistance detection includes measuring the resistance value of the VBUS line. The Lightning testing port does not encompass protocol parsing functions.

In a second aspect, the disclosure further provides a USB data cable testing method, including the continuity detecting, internal resistance testing, E-marker detecting, charging head detecting, and pull-up/pull-down resistance detecting.

The continuity detecting includes the following steps:

connecting two ends of a cable to be tested to the USB output end and the USB input end respectively;

outputting, by the main controller module, a level signal to the USB input end; and monitoring voltage changes at respective pins of the USB output end, and generating and displaying a topology diagram of internal wire connections of the cable to be tested.

The internal resistance testing includes the following steps:

making an MOS transistor of the internal resistance testing circuit conduct; and measuring a voltage across a 5.1 Ω reference resistor of the internal resistance testing circuit, and calculating and displaying an internal resistance value of a VBUS path of the cable to be tested.

The E-marker detecting and charger protocol identification include the following steps:

instructing, by the main controller module, a FUSB302BMPX chip as the protocol parsing chip to read CC1/CC2 signals;

parsing a USB-PD message returned by a USB charging head, and extracting and displaying supported charging protocols and charging capability parameters of the USB charger; and parsing a USB-PD message returned by an E-Marker chip and the USB-PD message returned by the USB charging head, and extracting and displaying cable power capacity and data transmission capability parameters, voltage, current and power parameters of the USB charging head, and supported protocols of the USB charging head.

The charging head detecting includes the following steps:

sending, by the main controller module, a charging head detection command to the FUSB302BMPX chip, communicating, by the FUSB302BMPX chip, with the USB charging head via the CC1/CC2 signals to obtain charging head information, returning, by the FUSB302BMPX chip, the USB-PD message, extracting and displaying the supported protocols and voltage and current capability parameters of the USB charging head.

The pull-up/pull-down resistance detecting includes the following steps:

determining presence and values of a pull-up resistor and a pull-down resistor on a CC line of a USB type-A to USB type-C cable or a USB type-C to USB type-C cable.

In an embodiment, the continuity detecting further includes: monitoring, by the main controller module, level responses of D+/D−/CC signal lines to identify a cable type as a charging cable, a low-speed data cable, a or high-speed data cable.

In an embodiment, the internal resistance testing further includes: when an ambient temperature exceeds 25° C., activating automatically, by the main controller module, a temperature compensation algorithm to correct the internal resistance value.

In an embodiment, a Lightning cable only performs the continuity detecting and the VBUS internal resistance testing, and does not conduct protocol parsing.

Compared to the related art, the integrated USB data cable testing device and the USB data cable testing method provided by the disclosure has the following beneficial effects.

The disclosure, for the first time, integrates the continuity detection, internal resistance testing, E-Marker identification, charging head detection, and pull-up/pull-down resistor detection into a single device, thereby addressing the pain point of traditional testing that requires collaboration among multiple devices, and achieving multi-function testing with one device. The disclosure incorporates seven types of ports: USB type-C, USB micro B 2.0/3.0, USB mini B 2.0, USB type-A 3.0, and Lightning. This allows for the testing of most types of USB cables available on the market. The internal resistance testing has a low error rate, and the pull-up/pull-down resistor detection can prevent low charging efficiency caused by mismatches between charging cables and charging heads, reducing the rate of misjudgment. Users can complete one-click testing operations in just three steps: plugging in the cable, pressing a button to select the mode, and reading the results, which is convenient and quick, achieving precise, efficient, and universal testing of USB data cables, and filling the technological gap for multi-port, full-function portable testing devices.

These aspects or other aspects of the disclosure will be more concise and understandable in the description of the following embodiments. It should be understood that the above general description and the subsequent detailed description are only exemplary and explanatory, and should not limit the scope of the disclosure.

BRIEF DESCRIPTION OF DRAWINGS

In order to provide a clearer explanation of technical solutions in embodiments of the present invention or in the related art, a brief introduction will be given to the accompanying drawings required for the description of the exemplary embodiments or the related art. The accompanying drawings are used to provide further understanding of the disclosure and form a part of the specification. They are used together with the embodiments of the disclosure to explain the disclosure and do not constitute limitations on the disclosure.

DESCRIPTION OF REFERENCE SIGNS

Figure 1:
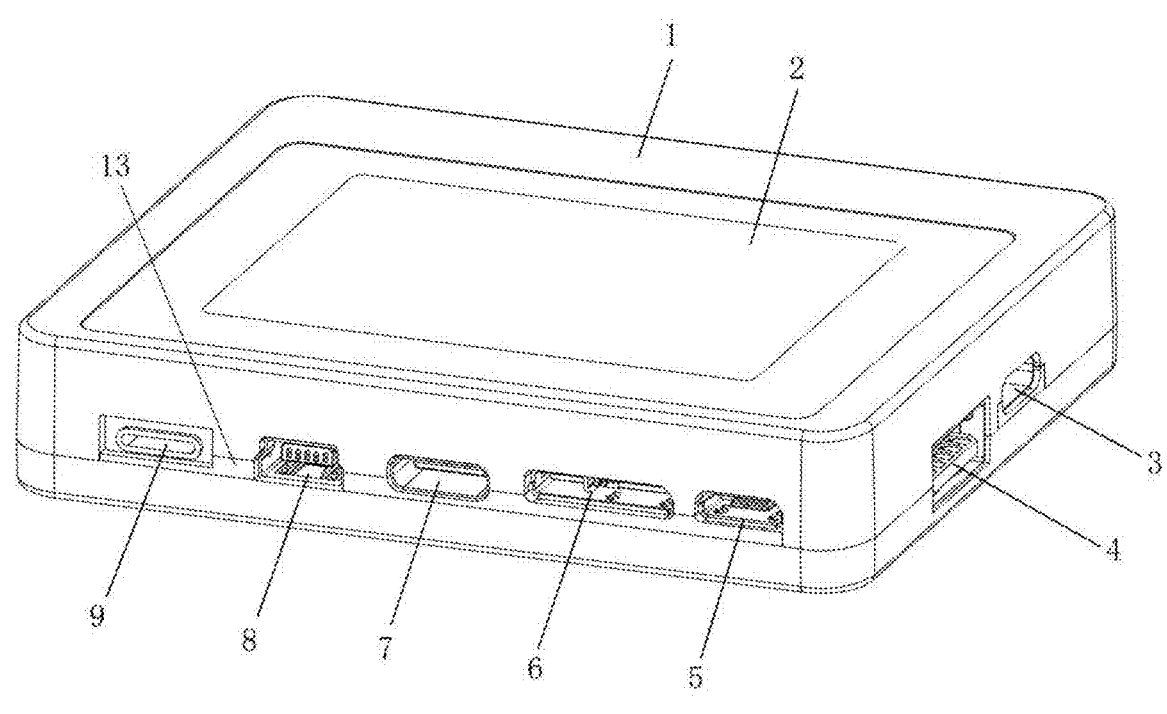
FIG. 1 illustrates a top and bottom isometric view of an integrated USB data cable testing device of the disclosure.

1—housing; 2—multi-level testing interface; 3—first USB type-C cable testing port; 4—USB type-A port; 5—USB micro B 2.0 port; 6—USB micro B 3.0 port; 7—second USB type-C cable testing port; 8—USB mini B 2.0 port; 9—Lightning testing port; 10—USB type-C port for power supply and programming; 11—swtich; 12—button; 13—multi-port testing board; 14—main controller module; 15—integrated detection module; 16—dual-mode power supply module; 17—human-machine interaction module; 18—main control MCU; 19—protocol parsing chip; 20—I²C bus; 21—AAA battery compartment; 22—external USB type-C power supply port; 23—switch for power supply switching; 24—power supply; 27—continuity detecting circuit; 28—internal resistance testing circuit; 29—E-marker identification circuit; 30—pull-up/pull-down resistance detecting circuit; 31—USB input end; 32—USB output end.

DETAILED DESCRIPTION OF EMBODIMENTS

Combined with the accompanying drawings and specific implementation methods, a further description of the disclosure is provided below. It should be noted that, without conflicting, the various embodiments or technical features described below can be combined arbitrarily to form new embodiments.

In order to clarify the purpose, technical solution, and advantages of the disclosure, the following embodiments will be further described in detail with reference to specific examples and the accompanying drawings. It should be understood that the specific embodiments described herein are only used to explain the disclosure and are not intended to limit the disclosure.

It should be noted that all expressions using "first" and "second" in the embodiments of the disclosure are intended to distinguish between two non-identical entities or parameters with the same name. It can be seen that "first" and "second" are only for the convenience of expression and should not be understood as limiting the embodiments of the disclosure. In addition, the terms "including" and "having", as well as any variations thereof, are intended to cover non-exclusive inclusions, such as processes, methods, systems, products, or devices that contain a series of steps or units inherent to other steps or units.

The following will provide a clear and complete description of the technical solution in the embodiments of the disclosure, based on the accompanying drawings. Apparently, the described embodiments are a part of the embodiments of the disclosure, not all of them. Based on the embodiments in the disclosure, all other embodiments obtained by those skilled in the art without creative labor are within the scope of protection of the disclosure.

The flowchart shown in the attached drawings is only an example and does not necessarily include all the content and operations/steps, nor does it have to be executed in the order described. For example, some operations/steps can also be decomposed, combined, or partially merged, so the actual execution order may change according to the actual situation.

Some embodiments of the disclosure will be described in detail below with reference to the accompanying drawings. In non-conflicting situations, the following embodiments and their features can be combined with each other.

Figure 2:
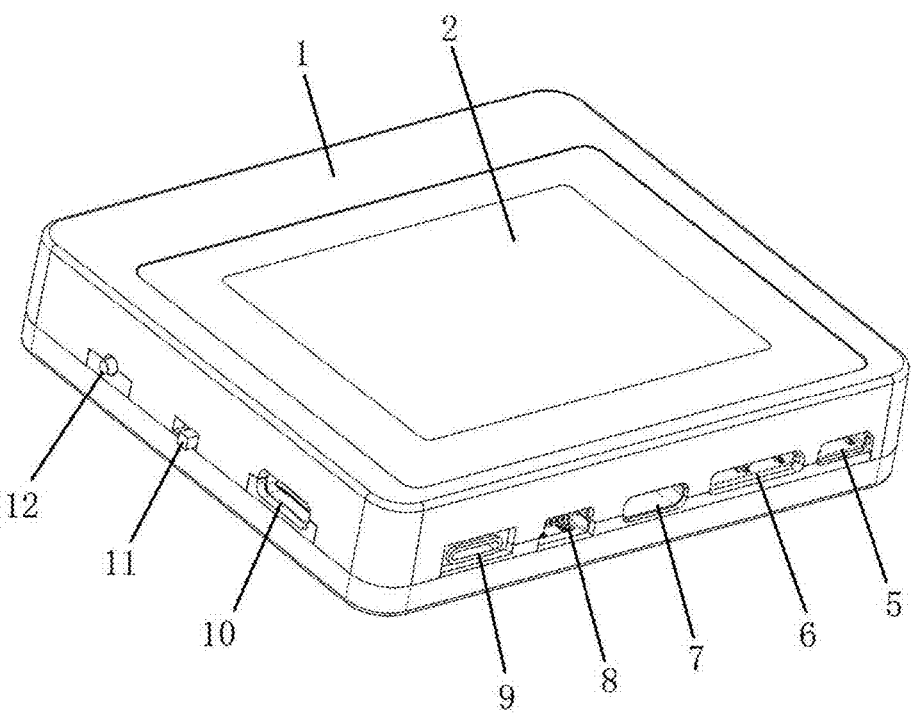
FIG. 2 illustrates a left and right isometric view of the integrated USB data cable testing device of the disclosure.
Figure 3:
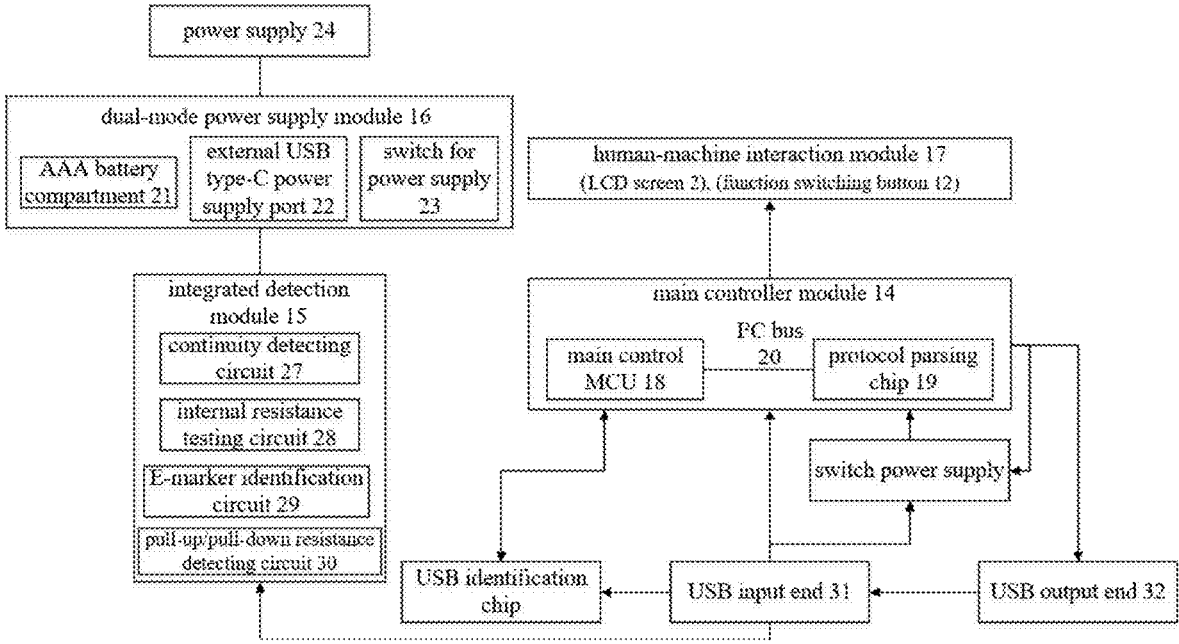
FIG. 3 illustrates a schematic diagram of a measurement principle of the integrated USB data cable testing device of the disclosure.
Figure 4:
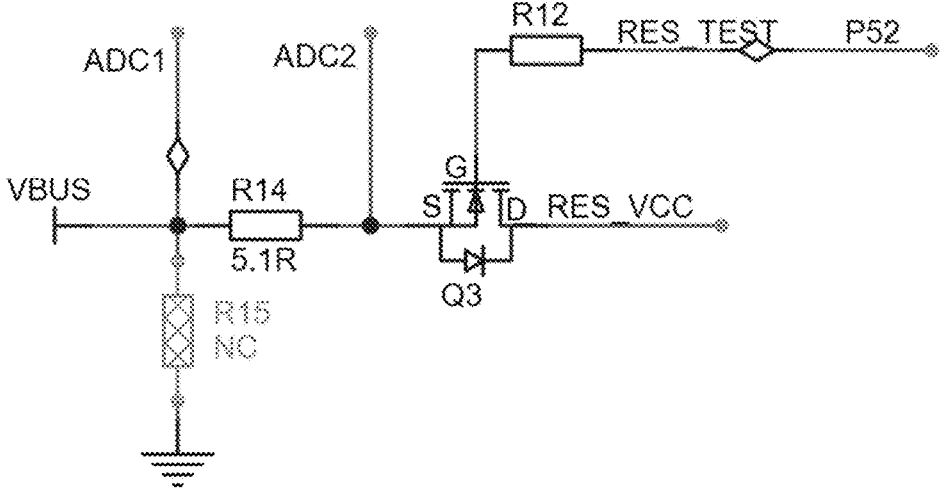
FIG. 4 illustrates a schematic diagram of an internal resistance testing circuit in the integrated USB data cable testing device of the disclosure.
Figure 5:
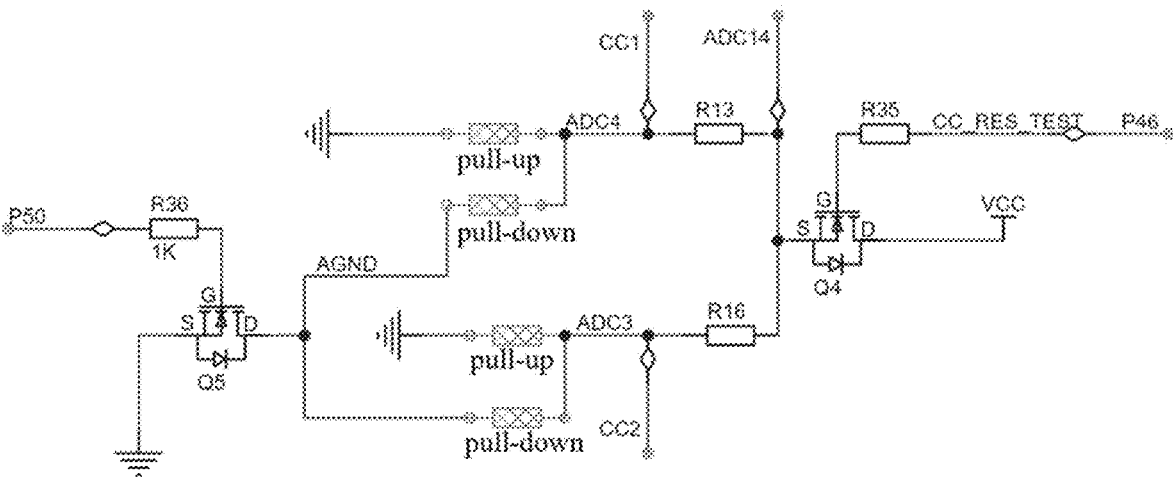
FIG. 5 illustrates a schematic diagram of a pull-up/pull-down resistance detecting circuit in the integrated USB data cable testing device of the disclosure.

Referring to FIGS. 1-5, an embodiment of the disclosure provides an integrated USB data cable testing device. The integrated USB data cable testing device includes: a multi-port testing board 13, a main controller module 14, an integrated detection module 15, a dual-mode power supply module 16, and a human-machine interaction module 17. The multi-port testing board 13 integrates at least seven types of USB ports and a Lightning port. The main controller module 14 includes: a main control MCU 18, and a protocol parsing chip 19. The main control MCU 18 is configured to perform continuity detecting, protocol parsing, and resistance calculation, and the protocol parsing chip 19 is connected to the main control MCU 18 via an I²C bus 20. The integrated detection module 15 includes: a continuity detecting circuit 27, an internal resistance testing circuit 28, an E-marker identification circuit 29, a charging head detecting circuit, and a pull-up/pull-down resistance detecting circuit 30. The continuity detecting circuit 27 is connected to pins of a USB output end 32 and a USB input end 31, and the E-marker identification circuit 29 and the charging head detecting circuit are connected to CC pins of the protocol parsing chip 19. The dual-mode power supply module 16 includes: an AAA battery compartment 21, an external USB type-C power supply port 22, and a switch for power supply switching 23. The dual-mode power supply module 16 is configured to support AAA battery power supply and external USB type-C power supply, and the switch for power supply switching 23 is a mechanical switch for power supply switching 23. The human-machine interaction module 17 includes: an LCD screen 2 and a function switching button 12. The human-machine interaction module 17 is configured to display continuity topology diagrams, internal resistance values, E-marker information, data cable protocol types, charging head protocols, and pull-up/pull-down resistance values.

In the embodiment, the multi-port testing board 13 is installed in a housing 1. The at least seven types of USB ports include: a USB type-C port 10 for power supply and programming, two USB type-C cable testing ports including: a first USB type-C cable testing port 3 and a second USB type-C cable testing port 7, a USB micro B 2.0 port 5, a USB micro B 3.0 port 6, a USB mini B 2.0 port 8, and a USB type-A 3.0 port 4. The Lightning port is a Lightning testing port 9.

The housing 1 is provided with a multi-level testing interface 2, a switch 11 and a button 12.

The main control MCU 18 is an STC32G12K128 microcontroller, the protocol parsing chip 19 includes an FUSB302BMPX chip connected to the main control MCU 18 via the I²C bus 20, and the protocol parsing chip 19 is configured to parse CC1/CC2 signals of a USB type-C cable to read E-marker and charging head protocol data.

In the embodiment, a working process of the continuity detecting circuit 27 includes:

applying a preset level signal via the USB output end 32,
monitoring voltage changes at respective pins of the USB input end 31,
identifying pin combinations with complete signal paths, and
generating and outputting cable topology data to the LCD screen 2.

During the continuity detection of a USB cable, the conductivity of internal wires of the cable is utilized for testing. Two ends of a USB cable are connected to the USB output end 32 and the USB input end 31 of the device, respectively. The USB output port provides a level signal. The USB port at the USB output end 32 is branched on a printed circuit board (PCB) and connected to the main control MCU 18. Once the USB output end 32 detects the level signal provided by the USB input end 31, it identifies the pins whose levels have changed. By connecting the MCU pins on the PCB to the corresponding pins of the USB port for identification, it determines which signal lines are present inside the USB cable. The MCU then converts the data into text and images, which are displayed on the LCD screen 2.

In the embodiment, the internal resistance testing circuit 28 includes an MOS transistor Q3 and a 5.1Ω reference resistor R14 with an accuracy of ±1% to form a series voltage divider circuit, and a gate of the MOS transistor is controlled by the main controller module 14.

A working process of the internal resistance testing circuit 28 includes:

making, by the main controller module 14, the MOS transistor Q3 conduct to activate the MOS transistor Q3 to form a series loop with a power supply 24, the 5.1 Ω reference resistor R14, and a cable VBUS, to thereby allow current to flow sequentially through the MOS transistor Q3, the 5.1Ω reference resistor R14, and a VBUS path of the cable to be tested;
measuring a voltage difference ΔV at a series node; and
calculating a cable internal resistance based on Ohm's law as follows:

$$R\_cable = (V\_measured \times R14)/(V\_source - V\_measured);$$

where V_source represents a supply voltage, and V_measured represents an actual voltage measured across the 5.1Ω reference resistor.

During the internal resistance testing of a USB cable, the voltage divider in series principle based on the Ohm's Law is utilized. When a current passes through a resistor, the voltage drops. When the USB cable is connected to the USB output end 32 and the USB input end 31, the button 12 is pressed to switch the LCD display to the resistance test interface. After interface switching, the MCU sends a signal to the MOS transistor Q3 in the internal resistance testing circuit 28, causing the gate of the MOS transistor Q3 to conduct. The drain of the MOS transistor Q3 is connected to the power supply 24, the source of the MOS transistor Q3 is connected to an end of the 5.1Ω resistor R14, and another end of the resistor R14 connected to the USB output end 32. When the MOS transistor Q3 is conducting, the current flows from the MOS transistor Q3 through the 5.1Ω resistor R14 and then through the USB output end 32 to the USB input end 31. At this time, the USB cable acts as an equivalent resistor, and the internal resistance of the cable can be calculated from the known resistance in the series circuit. The measured value is the internal resistance of the power line (VBUS) of the USB cable. The cable to be tested will not be affected in the test. The measurement accuracy is influenced by the accuracy of the 5.1 Ω resistor R14, the ambient temperature during testing, and the contact conditions when the cable is connected to the USB input end 31 and the USB output end 32. The 5.1Ω resistor R14 has an accuracy of 1%. Higher ambient temperatures during testing will result in a correspondingly higher internal resistance. After extensive testing, the accuracy of the resistor and the ambient temperature have minimal impact on the precision, which can almost be disregarded.

In the embodiment, a working process of the E-marker identification circuit 29 includes: sending, by the main control MCU 18, a detection command to the protocol parsing chip 19;

sending, by the protocol parsing chip 19, a USB-PD protocol query message through CC1/CC2 pins;

parsing a power supply capability data packet returned by an E-marker chip, and transmitting the power supply capability data packet to the main control MCU 18 for protocol classification via the $I^2C$ bus 20; and extracting, by the main control MCU 18, specification parameters including voltage/current, charger protocol identification, a cable type, a cable delay, a cable transmission speed, a cable supplier, a cable version number, and a cable protocol, and generating, by the main control MCU 18, a visual report.

During the E-Marker detection process for a USB type-C to USB type-C cable, the USB identification chip FUSB302BMPX on the PCB is used to recognize the E-marker chip. When the device switches to the USB-C E-marker interface via the button 12, the MCU sends a read signal to the FUSB302BMPX chip. After the FUSB302BMPX chip reads the signal on the CC1 and CC2 pins of the USB type-C connector, the FUSB302BMPX chip parses the signal on the CC1 and CC2 pins according to the USB protocol messages formulated by the USB-implementers forum (IF) to obtain parsed data, and the parsed data is sent to the MCU via the $I^2C$ bus 20. The MCU categorizes and processes the parsed data, and displays the relevant information on the LCD screen 2.

A working process of the charging head detecting circuit includes:

sending, by the main control MCU 18, a detection command to the protocol parsing chip 19;

sending, by the protocol parsing chip 19, a USB-PD protocol query message through the CC1/CC2 pins;

parsing a power supply capability data packet returned by a charging head chip, and transmitting the power supply capability data packet to the main control MCU 18 for protocol classification via the $I^2C$ bus 20; and extracting, by the main control MCU 18, voltage/current and charger protocol specification parameters, and generating, by the main control MCU 18, a visual report.

Specifically, when the USB type-C port of the USB input end 31 is connected to the charging head via a data cable, the USB identification chip FUSB302BMPX on the PCB is used to recognize the charging head chip. When switching to the charger test interface via the button 12, the MCU sends a read signal to the FUSB302BMPX chip. After reading the signal on the CC1 and CC2 of the charging head through the USB type-C cable, the FUSB302BMPX chip parses the signal on CC1 and CC2 according to the USB protocol message formulated by the USB-IF. After parsing, the parsed data is sent to the MCU via the $I^2C$ bus 20, and the MCU then categorizes and processes the parsed data, and displays the information that needs to be shown on the LCD screen 2.

In the embodiment, the pull-up/pull-down resistance detecting circuit 30 includes: controlled MOS transistors Q4/Q5 and fixed-value resistors R13/R16, and the main controller module 14 is configured to determine presence of a pull-up resistor and a pull-down resistor by switching GND pin levels (floating/pulled low) of the USB type-A port 4, the USB type-C port 10 and the two USB type-C cable testing ports 3/7.

Specifically, a working process of the pull-up/pull-down resistance detecting circuit 30 includes:

grounding a VBUS of each of the USB type-A 3.0 port 4, the USB type-C port 10 and the two USB type-C cable testing ports 3/7, and setting a GND pin of each of the USB type-A 3.0 port 4, the USB type-C port 10 and the two USB type-C cable testing ports 3/7 to a high-impedance state;

turning on, by the main controller module 14, an MOS transistor Q4 of the controlled MOS transistors, applying, by the main controller module 14, a test voltage V_test on a CC line; and when V_cc<V_source, determining that the pull-up resistor exists and calculating a resistance value of the pull-up resistor;

when V_cc≈V_source, pulling down the GND pin followed by re-detecting;

when Vcc<V_source, determining that the pull-down resistor exists and calculating a resistance value of the pull-down resistor.

During the detection of pull-up/pull-down resistors on USB type-A to USB type-C or USB type-C to USB type-C cables, the Ohm's law is utilized. An MOS transistor is placed in series between the power supply 24 and a fixed resistor (i.e., a fixed-value resistor), a gate of the MOS transistor is connected to the MCU, and the MCU controls whether the MOS transistor conducts or not. When the MCU provides a gate level to turn on the MOS transistor, the MOS transistor connects the power supply 24 and an end of the fixed resistor in series. Another end of the fixed resistor is connected to the CC line on the USB output end 32. When the USB cable is connected between the USB output end 32 and the USB input end 31, the internal pull-up or pull-down resistor on the CC line is in series with the fixed resistor at the power supply side. The resistance value of the pull-up/pull-down resistor can then be calculated using the Ohm's law. To determine whether the pull-up/pull-down resistor is a pull-up resistor or a pull-down resistor, the following steps are performed. The VBUS pins of USB type-A and USB type-C ports on the USB input end 31 are connected to the GND of the power supply 24, and the GND pins of the USB type-A and USB type-C ports on the USB input end 31 are connected to the MCU. During resistance measurement, the MCU pins connected to the GND pins of the USB type-A and USB type-C ports is set to a floating state. The MCU then turns on the MOS transistor in the pull-up/pull-down resistor detection circuit. The CC line is connected through a fixed resistor to an equivalent power supply 24. At this point, the voltage on the CC line is measured. If the voltage on the CC line is less than the supply voltage, it indicates that there is a pull-up resistor on the CC line. The MCU then calculates the resistance value of the pull-up resistor using the Ohm's law. If the voltage on the CC line is equal to or close to the supply voltage, it means that there is no pull-up resistor on the CC line. After confirming the absence of a pull-up resistor, the MCU pulls the level of the GND pin connected to the USB type-A/USB type-C ports low, allowing the current to flow from the CC line into the MCU; and then the voltage on the CC line is measured. If the voltage on the CC line is less than the supply voltage, it indicates that there is a pull-down resistor on the CC line. The MCU then calculates the resistance value of the pull-down resistor. If the voltage on the CC line is equal to or close to the supply voltage, it means that there is no pull-down resistor on this CC line.

In the embodiment, the human-machine interaction module 17 includes multi-level testing interfaces, including: a continuity test interface, a protocol test interface, an E-marker test interface, a charging head detection interface, a pull-up/pull-down resistor test interface, and an internal resistance test interface.

The continuity test interface is configured to display a topology diagram of a cable pin connection status.

The protocol test interface is configured to display a support status of USB 2.0/3.2/PD protocols.

The E-Marker test interface is configured to display power specifications and certification information of the cable.

The charging head detection interface is configured to display power supply protocols supported by the charging head.

The pull-up/pull-down resistor test interface is configured to display whether the pull-up resistor and the pull-down resistor are present on the CC line and output their resistance values.

The internal resistance test interface is configured to display the resistance values of the VBUS/GND lines and the qualification threshold.

In the embodiment, the Lightning testing port only supports: the continuity detection, and the internal resistance detection. The continuity detection includes: testing the connectivity of the power line, data line, and ID line. The internal resistance detection includes measuring the resistance value of the VBUS line. The Lightning testing port does not encompass protocol parsing functions.

During the testing of a Lightning cable, the internal circuitry continuity and the internal resistance of the power line are tested, but the protocol of the Lightning line is not identified.

The integrated USB data cable testing device of the disclosure utilizes the STC32G12K128 chip, which is configured to convert the information collected from the USB port into intuitive images and text displayed on the LCD screen 2. It also communicates with the protocol chip FUSB302BMPX. When the function is switched to detect E-marker or charger, a detection command is sent to the FUSB302BMPX. The FUSB302BMPX then communicates with the CC1 and CC2 on the USB type-C port. The USB type-C cable with an E-Marker chip and the charging head with a charging protocol will respond to the FUSB302BMPX chip with a segment of data. The FUSB302BMPX chip will identify the segment of data and send it to the MCU. The MCU will categorize the data that has been read and display the necessary information on the LCD screen 2 for the user to view.

The embodiment of the disclosure further provides a USB data cable testing method, including the continuity detecting, internal resistance testing, E-marker detecting, charging head detecting, and pull-up/pull-down resistance detecting.

The continuity detecting includes the following steps:
connecting two ends of a cable to be tested to the USB output end 32 and the USB input end 31 respectively;
outputting, by the main controller module 14, a level signal to the USB input end 31; and
monitoring voltage changes at respective pins of the USB output end 32, and generating and displaying a topology diagram of internal wire connections of the cable to be tested.

The internal resistance testing includes the following steps:
making an MOS transistor Q3 of the internal resistance testing circuit 28 conduct; and
measuring a voltage across a 5.1 Ω reference resistor R14 of the internal resistance testing circuit 28, and calculating and displaying an internal resistance value of a VBUS path of the cable to be tested.

The E-marker detecting and charger protocol identification include the following steps:
instructing, by the main controller module 14, a FUSB302BMPX chip as the protocol parsing chip 19 to read CC1/CC2 signals;
parsing a USB-PD message returned by a USB charging head, and extracting and displaying supported charging protocols and charging capability parameters of the USB charger; and
parsing a USB-PD message returned by an E-Marker chip and the USB-PD message returned by the USB charging head, and extracting and displaying cable power capacity and data transmission capability parameters, voltage, current and power parameters of the USB charging head, and supported protocols of the USB charging head.

The charging head detecting includes the following steps:
sending, by the main controller module 14, a charging head detection command to the FUSB302BMPX chip, communicating, by the FUSB302BMPX chip, with the USB charging head via the CC1/CC2 signals to obtain charging head information, returning, by the FUSB302BMPX chip, the USB-PD message, extracting and displaying the supported protocols and voltage and current capability parameters of the USB charging head.

The pull-up/pull-down resistance detecting includes the following steps:
determining presence and values of a pull-up resistor and a pull-down resistor on a CC line of a USB type-A to USB type-C cable or a USB type-C to USB type-C cable.

In the embodiment, the continuity detecting further includes: monitoring, by the main controller module 14, level responses of D+/D−/CC signal lines to identify a cable type as a charging cable, a low-speed data cable, a or high-speed data cable.

In the embodiment, the internal resistance testing further includes: when an ambient temperature exceeds 25° C., activating automatically, by the main controller module 14, a temperature compensation algorithm to correct the internal resistance value.

In an embodiment, a Lightning cable only performs the continuity detecting and the VBUS internal resistance testing, and does not conduct protocol parsing.

The disclosure, for the first time, integrates the continuity detection, internal resistance testing, E-marker identification, charging head detection, and pull-up/pull-down resistor detection into a single device, thereby addressing the pain point of traditional testing that requires collaboration among multiple devices, and achieving multi-function testing with one device. The disclosure incorporates seven types of ports: USB type-C, USB micro B 2.0/3.0, USB mini B 2.0, USB type-A 3.0, and Lightning. This allows for the testing of most types of USB cables available on the market. The internal resistance testing has a low error rate, and the pull-up/pull-down resistor detection can prevent low charging efficiency caused by mismatches between charging cables and charging heads, reducing the rate of misjudgment. Users can complete one-click testing operations in just three steps: plugging in the cable, pressing a button to select the mode, and reading the results, which is convenient and quick, achieving precise, efficient, and universal testing of USB data cables, and filling the technological gap for multi-port, full-function portable testing devices.

The above are exemplary embodiments disclosed in the disclosure, but it should be noted that various changes and modifications can be made without departing from the scope of the illustrated embodiments of the disclosure as defined by the claims. The functions, steps, and/or actions of the method claims described herein do not need to be performed in any specific order. In addition, although the elements disclosed in the embodiments of the disclosure may be described or claimed in individual form, they may also be understood as multiple unless explicitly limited to the singular.

It should be understood that in the disclosure, unless the context clearly supports an exception, the singular form "one" is intended to include the plural form as well. It should also be understood that the term "and/or" used in the disclosure refers to any and all possible combinations including one or more items listed in association. The above disclosed embodiment numbers of the disclosure are for description only and do not represent the advantages or disadvantages of the embodiments.

Those skilled in the art should understand that the discussion of any of the above embodiments is only exemplary and is not intended to imply that the scope of the illustrated embodiments of the disclosure (including claims) is limited to these examples. Under the concept of the embodiments of the disclosure, the technical features in the above embodiments or different embodiments can also be combined, and there are many other variations in different aspects of the embodiments of the disclosure as described above, which are not provided in detail for the sake of simplicity. Therefore, any omission, modification, equivalent substitution, improvement, etc. made within the spirit and principles of the embodiments of the disclosure should be included in the scope of protection of the embodiments of the disclosure.

What is claimed is:

1. An integrated universal serial bus (USB) data cable testing device, comprising:
   a multi-port testing board, integrating at least seven types of USB ports and a Lightning port;
   a main controller module, comprising: a main control microcontroller unit (MCU), and a protocol parsing chip, wherein the main control MCU is configured to perform continuity detecting, protocol parsing, and resistance calculation, and the protocol parsing chip is connected to the main control MCU via an inter-integrated circuit (I²C) bus;
   an integrated detection module, comprising a continuity detecting circuit, an internal resistance testing circuit, an E-marker identification circuit, a charging head detecting circuit, and a pull-up and pull-down resistance detecting circuit, wherein the continuity detecting circuit is connected to pins of a USB output end and a USB input end, and the E-marker identification circuit and the charging head detecting circuit are connected to configuration channel (CC) pins of the protocol parsing chip;
   a dual-mode power supply module, comprising: an AAA battery compartment, an external USB type-C power supply port, and a switch for power supply switching, wherein the dual-mode power supply module is configured to support AAA battery power supply and external USB type-C power supply, and the switch for power supply switching is a mechanical switch for power supply switching; and
   a human-machine interaction module, comprising a liquid crystal display (LCD) screen and a function switching button, wherein the human-machine interaction module is configured to display continuity topology diagrams, internal resistance values, E-marker information, data cable protocol types, charging head protocols, and pull-up and pull-down resistance values.

2. The integrated USB data cable testing device as claimed in claim 1, wherein the at least seven types of USB ports comprise:
   a USB type-C port for power supply and programming,
   two USB type-C cable testing ports,
   a USB micro B 2.0 port,
   a USB micro B 3.0 port, and
   a USB mini 2.0 port,
   a USB type-A 3.0 port; and
   wherein the Lightning port is a Lightning testing port.

3. The integrated USB data cable testing device as claimed in claim 1, wherein the main control MCU is an STC32G12K128 microcontroller, the protocol parsing chip comprises an FUSB302BMPX chip connected to the main control MCU via the I²C bus, and the protocol parsing chip is configured to parse CC1 and CC2 signals of a USB type-C cable to read E-marker and charging head protocol data.

4. The integrated USB data cable testing device as claimed in claim 3, wherein a working process of the continuity detecting circuit comprises:
   applying a preset level signal via the USB output end,
   monitoring voltage changes at respective pins of the USB input end,
   identifying pin combinations with complete signal paths, and
   generating and outputting cable topology data to the LCD screen.

5. The integrated USB data cable testing device as claimed in claim 1, wherein the internal resistance testing circuit comprises a metal oxide semiconductor (MOS) transistor and a 5.1 ohms (Ω) reference resistor with an accuracy of ±1% to form a series voltage divider circuit, and a gate of the MOS transistor is controlled by the main controller module.

6. The integrated USB data cable testing device as claimed in claim 5, wherein a working process of the internal resistance testing circuit comprises:
   making, by the main controller module, the MOS transistor conduct to activate the MOS transistor to form a series loop with a power supply, the 5.1Ω reference resistor, and a cable voltage bus (VBUS), to thereby allow current to flow sequentially through the MOS transistor, the 5.1Ω reference resistor, and a VBUS path of a cable to be tested;
   measuring a voltage difference ΔV at a series node; and
   calculate a cable internal resistance based on Ohm's law as follows:

$$R\_cable = (V\_measured \times R14)/(V\_source - V\_measured);$$

where V_source represents a supply voltage, R14 represents a resistance value of the 5.1Ω reference resistor, and V_measured represents an actual voltage measured across the 5.1Ω reference resistor.

7. The integrated USB data cable testing device as claimed in claim 6, wherein a working process of the E-marker identification circuit comprises:
   sending, by the main control MCU, a detection command to the protocol parsing chip;

sending, by the protocol parsing chip, a USB-power delivery (PD) protocol query message through CC1 and CC2 pins;

parsing a power supply capability data packet returned by an E-marker chip, and transmitting the power supply capability data packet to the main control MCU for protocol classification via the I²C bus; and extracting, by the main control MCU, specification parameters comprising voltage and current, charger protocol identification, a cable type, a cable delay, a cable transmission speed, a cable supplier, a cable version number, and a cable protocol, and generating, by the main control MCU, a visual report.

8. The integrated USB data cable testing device as claimed in claim 1, wherein the pull-up and pull-down resistance detecting circuit comprises: controlled MOS transistors and fixed-value resistors; and the main controller module is configured to determine presence of a pull-up resistor and a pull-down resistor by switching ground (GND) pin levels of a USB type-A 3.0 port, a USB type-C port and two USB type-C cable testing ports.

9. The integrated USB data cable testing device as claimed in claim 8, wherein a working process of the pull-up and pull-down resistance detecting circuit comprises:

grounding a VBUS of each of the USB type-A 3.0 port, the USB type-C port and the two USB type-C cable testing ports, and setting a GND pin of each of the USB type-A 3.0 port, the USB type-C port and the two USB type-C cable testing ports to a high-impedance state;

turning on, by the main controller module, an MOS transistor of the controlled MOS transistors, and applying, by the main controller module, a test voltage V_test on a CC line; and when V_cc<V_source, determining that the pull-up resistor exists and calculating a resistance value of the pull-up resistor;

when V_cc≈V_source, pulling down the GND pin followed by re-detecting;

when Vcc<V_source, determining that the pull-down resistor exists and calculating a resistance value of the pull-down resistor.

10. A USB data cable testing method based on the integrated USB data cable testing device as claimed in claim 1, comprising: the continuity detecting, internal resistance testing, E-marker detecting, charging head detecting, and pull-up and pull-down resistance detecting;

wherein the continuity detecting comprises the following steps:

connecting two ends of a cable to be tested to the USB output end and the USB input end respectively;

outputting, by the main controller module, a level signal to the USB input end; and monitoring voltage changes at respective pins of the USB output end, and generating and displaying a topology diagram of internal wire connections of the cable to be tested;

wherein the internal resistance testing comprises the following steps:

making an MOS transistor of the internal resistance testing circuit conduct; and measuring a voltage across a 5.1Ω reference resistor of the internal resistance testing circuit, and calculating and displaying an internal resistance value of a VBUS path of the cable to be tested;

wherein the E-marker detecting and charger protocol identification comprise the following steps:

instructing, by the main controller module, a FUSB302BMPX chip as the protocol parsing chip to read CC1 and CC2 signals;

parsing a USB-PD message returned by a USB charging head, and extracting and displaying supported charging protocols and charging capability parameters of the USB charger charging head; and parsing a USB-PD message returned by an E-marker chip and the USB-PD message returned by the USB charging head, and extracting and displaying cable power capacity and data transmission capability parameters, voltage, current and power parameters of the USB charging head, and supported protocols of the USB charging head;

wherein the charging head detecting comprises the following steps:

sending, by the main controller module, a charging head detection command to the FUSB302BMPX chip, communicating, by the FUSB302BMPX chip, with the USB charging head via the CC1 and CC2 signals to obtain charging head information, returning, by the FUSB302BMPX chip, the USB-PD message, extracting and displaying the supported protocols and voltage and current capability parameters of the USB charging head;

wherein the pull-up and pull-down resistance detecting comprises the following steps:

determining presence and values of a pull-up resistor and a pull-down resistor on a CC line of a USB type-A to USB type-C cable or a USB type-C to USB type-C cable.

* * * * *